United States Patent
Jeon et al.

(10) Patent No.: US 10,923,181 B2
(45) Date of Patent: Feb. 16, 2021

(54) SEMICONDUCTOR MEMORY DEVICE AND MEMORY SYSTEM HAVING THE SAME

(71) Applicant: Samsung Electronics Co., Ltd., Suwon-si (KR)

(72) Inventors: Ju Ho Jeon, Hwasung-si (KR); Hun-Dae Choi, Hwaseong-si (KR)

(73) Assignee: Samsung Electronics Co., Ltd, Gyeonggi-do (KR)

(*) Notice: Subject to any disclaimer, the term of this patent is extended or adjusted under 35 U.S.C. 154(b) by 0 days.

(21) Appl. No.: 16/248,004

(22) Filed: Jan. 15, 2019

(65) Prior Publication Data

US 2020/0027498 A1 Jan. 23, 2020

(30) Foreign Application Priority Data

Jul. 23, 2018 (KR) .................. 10-2018-0085303

(51) Int. Cl.
| | |
|---|---|
| *G11C 11/4093* | (2006.01) |
| *G11C 11/4094* | (2006.01) |
| *H03K 19/00* | (2006.01) |
| *G11C 11/4076* | (2006.01) |
| *G11C 11/4096* | (2006.01) |
| *G11C 11/408* | (2006.01) |

(52) U.S. Cl.
CPC ...... *G11C 11/4093* (2013.01); *G11C 11/4076* (2013.01); *G11C 11/4087* (2013.01); *G11C 11/4094* (2013.01); *G11C 11/4096* (2013.01); *H03K 19/0005* (2013.01)

(58) Field of Classification Search
CPC .................................................. G11C 11/4093
See application file for complete search history.

(56) References Cited

U.S. PATENT DOCUMENTS

| 7,038,486 B2 * | 5/2006 | Aoyama | H03H 11/30 |
|---|---|---|---|
| | | | 326/108 |
| 7,457,176 B2 * | 11/2008 | Dono | G11C 7/222 |
| | | | 365/191 |
| 8,243,534 B2 | 8/2012 | Fujisawa | |
| 8,576,645 B2 | 11/2013 | Kim | |

(Continued)

FOREIGN PATENT DOCUMENTS

| KR | 10-2015-0064172 A | 8/2015 |
|---|---|---|
| KR | 10-2017-0008861 A | 1/2017 |

*Primary Examiner* — Muna A Techane
(74) *Attorney, Agent, or Firm* — Harness, Dickey & Pierce, P.L.C.

(57) ABSTRACT

The semiconductor memory device including a data strobe signal input buffer configured to receive a data strobe signal and generate an input data strobe signal, a data input buffer configured to receive data delayed by a first delay time compared to the data strobe signal and generate input data, a latency control signal generator configured to generate and activate a first on-die termination control signal during a first period in which the data strobe signal is applied in response to receiving a write command, a first on-die termination control circuit configured to vary a first variable resistance code in response to the first on-die termination control signal, and a data strobe signal termination circuit configured to terminate the data strobe signal and including a first on-die termination resistor, a resistance value of which varies in response to the first variable resistance code may be provided.

20 Claims, 10 Drawing Sheets

(56) References Cited

U.S. PATENT DOCUMENTS

| | | |
|---|---|---|
| 8,907,698 B2 | 12/2014 | Jung |
| 8,988,952 B2 | 3/2015 | Hiraishi et al. |
| 9,721,641 B2 | 8/2017 | Bains |
| 9,780,782 B2 | 10/2017 | Bains et al. |
| 2004/0190353 A1* | 9/2004 | Kim .................. G11C 29/1201 365/194 |
| 2004/0268028 A1* | 12/2004 | Lee .................... G06F 13/1689 711/105 |
| 2005/0015560 A1* | 1/2005 | Bae .................... G11C 7/1018 711/167 |
| 2009/0161455 A1* | 6/2009 | Ku ......................... G11C 7/22 365/193 |
| 2011/0199843 A1* | 8/2011 | Dreps ................. G06F 13/4243 365/193 |
| 2012/0113729 A1* | 5/2012 | Mochizuki ............... G11C 7/10 365/189.05 |
| 2013/0163353 A1* | 6/2013 | Hiraishi ................ G11C 7/222 365/193 |
| 2014/0055162 A1* | 2/2014 | Jung ............... H03K 19/01754 326/30 |
| 2017/0093400 A1 | 3/2017 | Bains et al. |

* cited by examiner

FIG. 4

| COM | CSB | CA | | | | | | | | CK (M1) | |
|---|---|---|---|---|---|---|---|---|---|---|---|
| | | CA1 | CA2 | CA3 | CA4 | CA5 | CA6 | | CAr | 1↑ | 2↑ |
| ACTIVATE | L | L | L | | | | | | | | |
| | X | | | | | | | | | | |
| WRITE | L | H | L | H | H | L | | | | | |
| | H | | | | | | | | | | |
| READ | L | H | L | H | H | H | | | | | |
| | H | | | | | | | | | | |
| MODE REGISTER SET | L | H | H | H | L | L | | | | | |
| | H | | | | | | | | | | |

SEMICONDUCTOR MEMORY DEVICE AND MEMORY SYSTEM HAVING THE SAME

CROSS-REFERENCE TO RELATED APPLICATION

This U.S. non-provisional patent application claims priority under 35 U.S.C. § 119 to Korean Patent Application No. 10-2018-0085303, filed on Jul. 23, 2018, in the Korean Intellectual Property Office (KIPO), the contents of which are hereby incorporated herein by reference in their entirety.

BACKGROUND

1. Field

Some example embodiments relate to semiconductor memory devices and/or memory systems including the same.

2. Discussion of Related Art

A memory system may include a semiconductor memory device and a memory controller. The memory controller may delay and transmit data by a desired (or alternatively, predetermined) delay time compared to a data strobe signal. Thus, a technology allowing the semiconductor memory device to effectively control on-die termination resistors for terminating the data and the data strobe signal is desired.

SUMMARY

Some example embodiments of the inventive concepts are directed to providing semiconductor memory devices configured to control on-die termination resistors for terminating data and a data strobe signal when data is applied after a certain (or alternatively, desired or predetermined) delay time compared to a data strobe signal, and/or memory systems having the same.

It should be noted that objects of the present inventive concepts are not limited to the above-mentioned objects, and other objects of the present inventive concepts will be apparent to those skilled in the art from the following descriptions.

According to an example embodiment of the inventive concepts, a semiconductor memory device includes a data strobe signal input buffer configured to receive a data strobe signal and generate an input data strobe signal, a data input buffer configured to receive data, which is delayed by a first delay time compared to the data strobe signal, and generate input data, a latency control signal generator configured to generate a first on-die termination control signal, which is activated during a first period in which the data strobe signal is applied, in response to receiving a write command, a first on-die termination control circuit configured to vary a first variable resistance code in response to the first on-die termination control signal, a data strobe signal termination circuit configured to terminate the data strobe signal, the data strobe signal termination circuit including a first on-die termination resistor, the first on-die termination resistor configured to vary a resistance value thereof in response to the first variable resistance code, a row decoder configured to decode a row address signal and generate a plurality of word line selection signals, a column decoder configured to decode a column address signal and generate a plurality of column selection signals, and a memory cell array including a plurality of memory cells and configured to write the input data to the memory cells selected by the plurality of word line selection signals and the plurality of column selection signals.

According to an example embodiment of the inventive concepts, a semiconductor memory device includes a data strobe signal input buffer configured to receive a data strobe signal and generate an input data strobe signal, a data input buffer configured to receive data, which is delayed by a first delay time compared to the data strobe signal, and generate input data, a latency control signal generator configured to generate a first on-die termination control signal and a second on-die termination control signal in response to receiving a write command is received, the latency control signal generator configured to activate the first on-die termination control signal during a first period in which the data strobe signal is applied, the latency control signal generator configured to activate the second on-die termination control signal during a second period in which the data is applied, a first on-die termination control circuit configured to vary a first variable resistance code in response to the first on-die termination control signal, a second on-die termination control circuit configured to vary a second variable resistance code in response to the second on-die termination control signal, a data strobe signal termination circuit configured to terminate the data strobe signal, the data strobe signal termination circuit including a first on-die termination resistor, the first on-die termination resistor configured to vary a resistance value thereof in response to the first variable resistance code, a data termination circuit configured to terminate the data, the data termination circuit including a second on-die termination resistor, the second on-die termination resistor configured to vary a resistance value thereof in response to the second variable resistance code, a row decoder configured to decode a row address signal and generate a plurality of word line selection signals, a column decoder configured to decode a column address signal and generate a plurality of column selection signals, and a memory cell array including a plurality of memory cells and configured to write the input data to the memory cells selected by the plurality of word line selection signals and the plurality of column selection signals.

According to an example embodiment of the inventive concepts, a memory system includes a memory controller configured to transmit a first inverted chip selection signal and a second inverted chip selection signal, a first memory configured to be selected in response to the first inverted chip selection signal, and a second memory configured to be selected in response to the second inverted chip selection signal. Each of the first and the second memories may include a data strobe signal input buffer configured to receive a data strobe signal transmitted from the memory controller, and generate an input data strobe signal, a data input buffer configured to receive data, which is delayed by a first delay time compared to the data strobe signal, and generate input data, a latency control signal generator configured to generate a first on-die termination control signal, which is activated during a first period in which the data strobe signal is applied, in response to receiving a write command is received, a first on-die termination control circuit configured to vary a first variable resistance code in response to the first on-die termination control signal, a data strobe signal termination circuit configured to terminate the data strobe signal, the data strobe signal termination circuit including a first on-die termination resistor, the first on-die termination resistor configured to vary a resistance value thereof in response to the first variable resistance code, a row decoder configured to decode a row address signal and generate a plurality of word line selection signals, a column decoder configured to decode a column address signal and generate a plurality of column selection signals, and a memory cell array including a plurality of memory cells and configured to write the input data to the memory cells selected by the plurality of word line selection signals and the column selection signals.

BRIEF DESCRIPTION OF THE DRAWINGS

The above and other objects, features and advantages of the inventive concepts will become more apparent to those of ordinary skill in the art by describing some example embodiments thereof in detail with reference to the accompanying drawings, in which:

FIG. 4 is a command truth table according to a command and address applied from a memory controller shown in FIG. 1 to the semiconductor memory device shown in FIGS. 2 and 3;

DETAILED DESCRIPTION

Hereinafter, semiconductor memory devices and/or memory systems having the same will be described with reference to the accompanying drawings according to some example embodiments of the inventive concepts.

Figure 1:
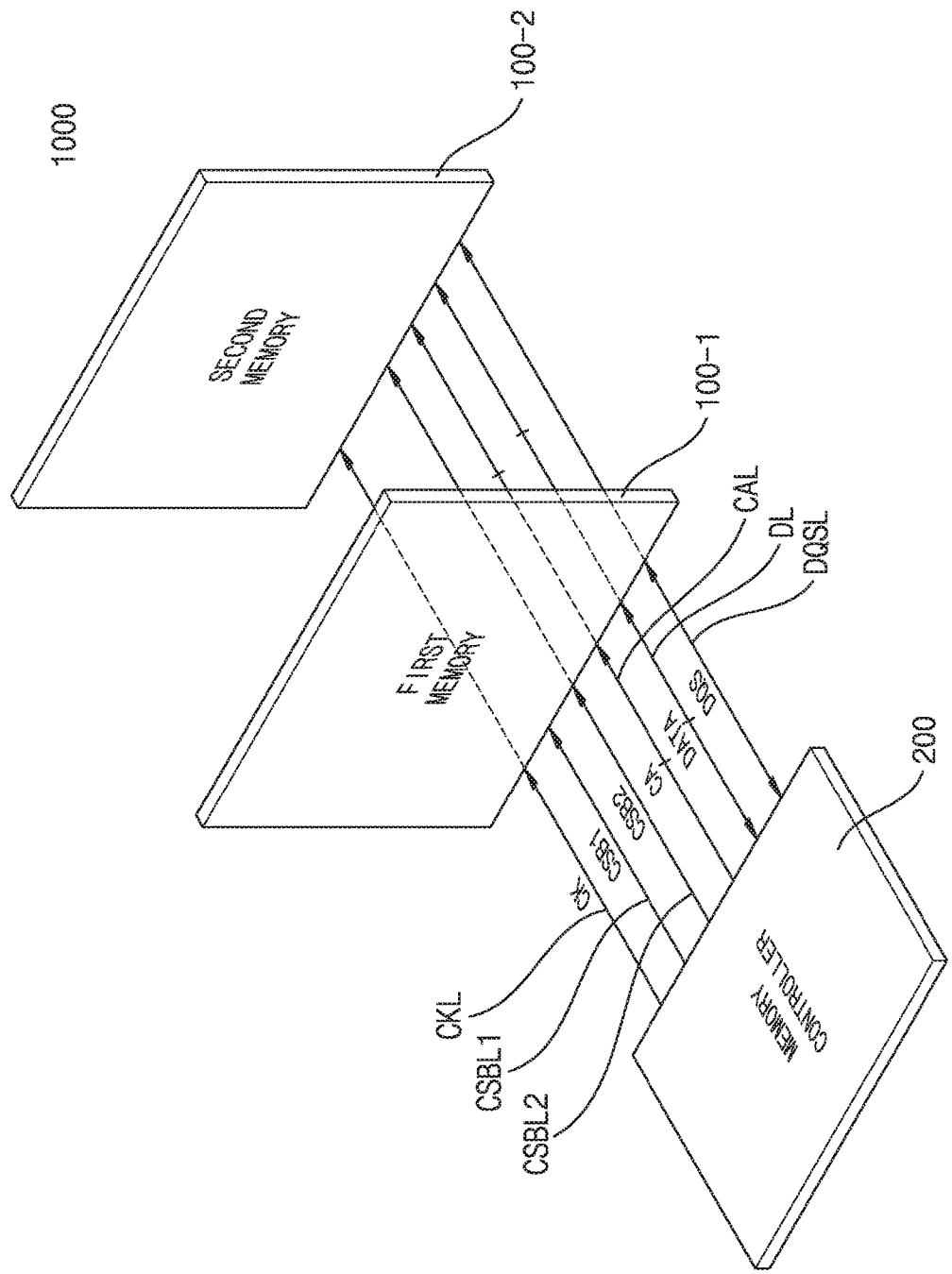
FIG. 1 is a block diagram illustrating a configuration of a memory system according to an example embodiment of the inventive concepts.

FIG. 1 is a block diagram illustrating a configuration of a memory system according to an example embodiment of the inventive concepts, and a memory system 1000 may include first and second memories 100-1 and 100-2, and a memory controller 200. Each of the first and second memories 100-1 and 100-2 may be a semiconductor memory device or a memory module including a plurality of semiconductor memory devices.

A function of each of the blocks shown in FIG. 1 will be described below.

The memory controller 200 may transmit a first inverted chip selection signal CSB1 (through a first inverted chip selection signal line CSBL1) and a command and address CA (through a command and address line CAL) with a clock signal CK (through a clock signal line CKL) to the first memory 100-1, and may input/output data DQ (through an input/output data signal line DQSL) with a data strobe signal DQS (through a data strobe signal line DQSL) to/from the first memory 100-1. The memory controller 200 may transmit a second inverted chip selection signal CSB2 (through a second inverted chip selection signal line CSBL2) and the command and address CA (through the command and address signal line CAL) with the clock signal CK (through the clock signal line CKL) to the second memory 100-2, and may input/output the data DQ (through the input/output data signal line DQSL) with the data strobe signal DQS (through the data strobe signal line DQSL) to/from the second memory 100-2. In this case, the memory controller 200 may delay and transmit the data DQ (through a data line DL) by a first desired (or alternatively, predetermined) delay time tDQS2DQ (see FIG. 5) compared to the data strobe signal DQS (e.g., compared to a first latching edge of the data strobe signal DQS). The memory controller 200 may transmit the data DQ to be aligned at a center of the data strobe signal DQS. Although not shown, the memory controller 200 may further transmit an inverted data strobe signal DQSB having an inverted phase of the data strobe signal DQS.

When the first or second inverted chip selection signal CSB1 or CSB2 and the command and address CA are applied with the clock signal CK, each of the first and second memories 100-1 and 100-2 may be selected by the first or second inverted chip selection signal CSB1 or CSB2, decode a command signal included in the command and address CA to generate an internal command, and generate an internal address or a mode setting code using an address signal included in the command and address CA. Further, when the data DQ is applied by being delayed by the first desired (or alternatively, predetermined) delay time tDQS2DQ compared to the data strobe signal DQS, each of the first and the second memories 100-1 and 100-2 may latch the data DQ in response to a delayed data strobe signal, which has been generated by internally delaying the data strobe signal DQS by or based on the first desired (or alternatively, predetermined) delay time tDQS2DQ. When the data DQ and the data strobe signal DQS are not applied, each of the first and second memories 100-1 and 100-2 may control each of a first on-die termination resistor (not shown) connected to a data strobe signal terminal (not shown), to which the data strobe signal DQS is applied, and second on-die termination resistors (not shown) connected to data terminals (not shown), to which the data DQ is applied, so as to have a first value (e.g., a default value). When the internal command is a write command, each of the first and second memories 100-1 and 100-2 may control the first on-die termination resistor (not shown) to have a second value during a first period in which the data strobe signal DQS is applied through the data strobe signal terminal (not shown), and control each of the second on-die termination resistors (not shown) to have the second value during a second period in which the data DQ is applied through the data terminals (not shown). That is, when the write command is generated, each of the first and second memories 100-1 and 100-2 may control the first on-die termination resistor (not shown) to have the second value during the first period, and control the second on-die termination resistors (not shown) to have the second value during the second period in consideration of the first desired (or alternatively, predetermined) delay time tDQS2DQ.

Figure 2:
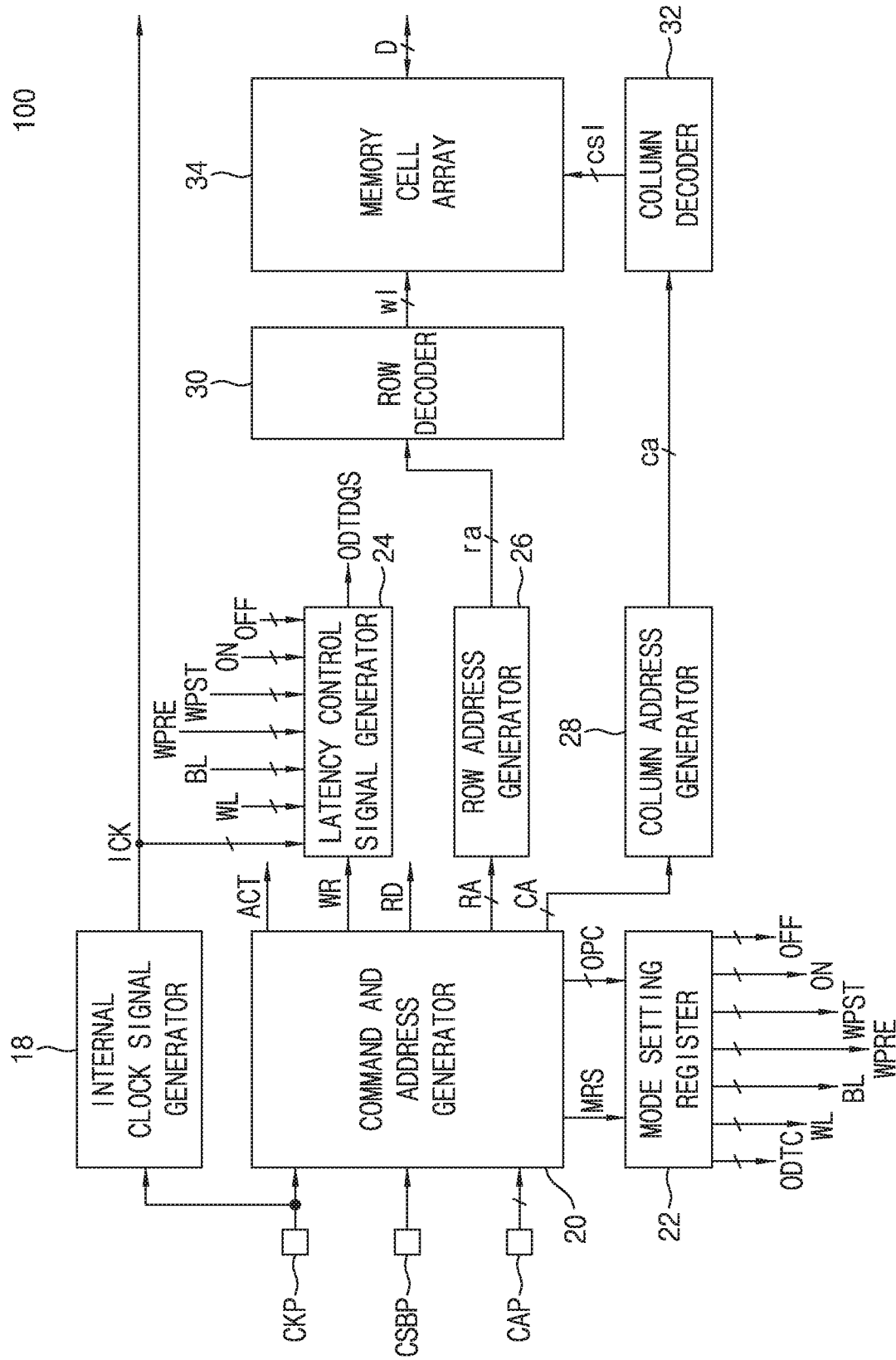
FIGS. 2 and 3 are block diagrams illustrating a configuration of a semiconductor memory device according to an example embodiment of the inventive concepts.
Figure 3:
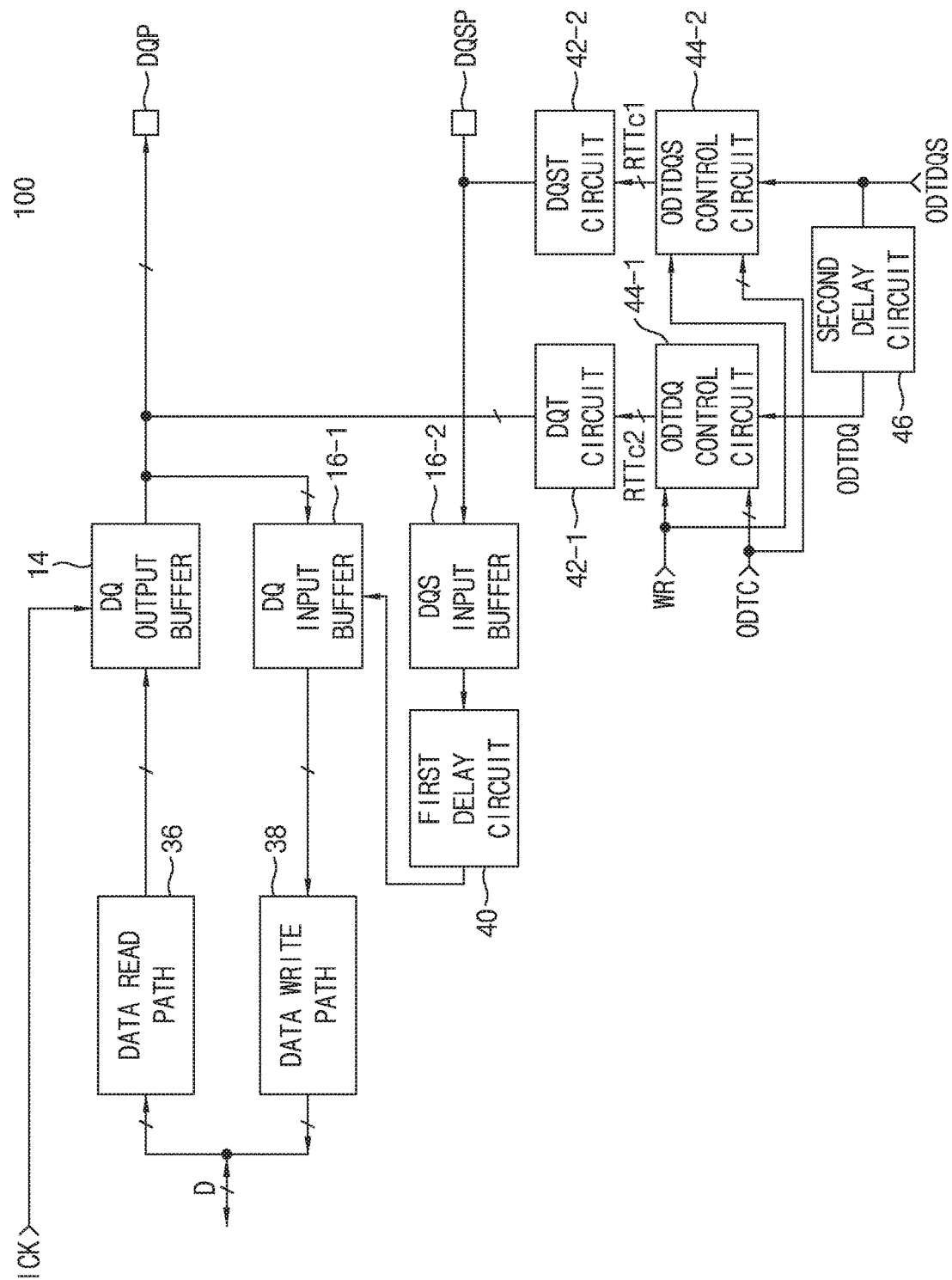

FIGS. 2 and 3 are block diagrams illustrating a configuration of a semiconductor memory device according to an example embodiment of the inventive concepts, and a semiconductor memory device 100 may include a data (DQ) output buffer 14, a DQ input buffer 16-1, a data strobe signal (DQS) input buffer 16-2, an internal clock signal generator 18, a command and address generator 20, a mode setting register 22, a latency control signal generator 24, a row address generator 26, a column address generator 28, a row decoder 30, a column decoder 32, a memory cell array 34, a data read path 36, a data write path 38, a first delay circuit 40, a DQ termination (DQT) circuit 42-1, a DQS termination (DQST) circuit 42-2, an on-die termination DQ (ODTDQ) control circuit 44-1, an ODTDQS control circuit 44-2, and a second delay circuit 46. Further, the semiconductor memory device 100 may include a CK terminal CKP to which a clock signal CK is applied, a CSB terminal CSBP to which an inverted chip selection signal CSB is applied, CA terminals CAP to which a command and address CA is applied, DQ terminals DQP through which data DQ is input/output, and a DQS terminal DQSP through which a data strobe signal DQS is input/output.

A function of each of the blocks shown in FIGS. 2 and 3 will be described below.

The DQ output buffer 14 may receive data output from the data read path 36, and output data through the DQ terminals DQP in response to an internal clock signal ICK. Although not shown, a DQS output buffer may be further provided. The DQS output buffer may generate an output data strobe signal in response to the internal clock signal ICK. The output data strobe signal may be generated together with the output data.

The DQ input buffer 16-1 may latch the data DQ input through the DQ terminals DQP in response to a delayed data strobe signal, and generate input data.

The internal clock signal generator 18 may generate the internal clock signal ICK synchronized with the clock signal CK. The internal clock signal generator 18 may be, for example, a delay lock loop (DLL).

The command and address generator 20 may receive the clock signal CK (through a clock signal terminal CKB), the inverted chip selection signal CSB (through a chip selection signal terminal CKB), and the command and address CA (through a command and address signal terminal CKB), decode a command signal included in the command and address CA to generate a mode setting command MRS, an active command ACT, a write command WR, or a read command RD, which is the internal command, and generate a row address RA, a column address CA, or a mode setting code OPC using an address signal included in the command and address CA.

The mode setting register 22 may receive the mode setting code OPC in response to the mode setting command MRS, and set values of a write latency WL, a burst length BL, and an on-die termination code ODTC according to the mode setting code OPC. Further, the mode setting register 22 may receive the mode setting code OPC in response to the mode setting command MRS, and further set values of a write preamble WPRE, a write postamble WPST, an on-die termination on offset ON, and an on-die termination off offset OFF according to the mode setting code OPC. The values of the write latency WL, the burst length BL, the write preamble WPRE, the write postamble WPST, the on-die termination code ODTC, the on-die termination on offset ON, and the on-die termination off offset OFF may be digital data consisting of a desired (or alternatively, predetermined) number of bits which are different from each other or are the same. Further, the value of each of the write preamble WPRE and the write postamble WPST may be an integer which is zero or more.

When the write command WR is generated, the latency control signal generator 24 may generate a first on-die termination control signal ODTDQS. The latency control signal generator 24 may activate the first on-die termination control signal ODTDQS after a delay corresponding to the number of clock cycles corresponding to a value of a first on-die termination on latency ODTDQSon (see FIG. 5) in response to the internal clock signal ICK, and deactivate the first on-die termination control signal ODTDQS after a delay corresponding to the number of clock cycles corresponding to a value of a first on-die termination off latency ODTDQSoff (see FIG. 5). The value of the first on-die termination on latency ODTDQSon may be generated using the value of the write latency WL. For example, the value of the first on-die termination on latency ODTDQSon may be a value obtained by adding a value obtained by subtracting the value of the write preamble WPRE from the value of the write latency WL and the value of the on-die termination on offset ON, that is, WL-WPRE+ON, or a value obtained by subtracting the value of the write preamble WPRE from the value of the write latency WL, that is, WL-WPRE. The value of the on-die termination on offset ON may have a value in a range from +1 to −3. The value of the first on-die termination off latency ODTDQSoff may be generated using the value of the write latency WL and the value of the burst length BL. For example, the value of the first on-die termination off latency ODTDQSoff may be a value obtained by adding the value of the write latency WL, the number of clock cycles corresponding to the value of the burst length BL (e.g., the number of clock cycles is BL/2 in the case that the semiconductor memory device 100 is a double data rate (DDR) dynamic random access memory (DRAM) device), and the value of the write postamble WPST, and the value of the on-die termination off offset OFF, that is, WL+BL/2+WPST+OFF, or a value obtained by adding the value of the write latency WL, the number of clock cycles corresponding to the value of the burst length BL, and the value of the write postamble WPST, that is, WL+BL/2+WPST. The value of the on-die termination off offset OFF may be a value in a range from −1 to +3, and may be +1.

The row address generator 26 may receive the row address RA and generate a row address signal ra.

The column address generator 28 may receive the column address CA and generate a column address signal ca.

The row decoder 30 may decode the row address signal ra and select one among word line selection signals wl.

The column decoder 32 may decode the column address signal ca and select one among column selection signals csl.

The memory cell array 34 may include a plurality of memory cells, and write/read data D to/from memory cells (not shown) selected by the selected one word line selection signal wl and the selected one column selection signal csl.

The data read path 36 may input the data D read from the selected memory cells and sequentially output data.

The data write path 38 may sequentially receive input data through the DQ terminal DQP, and output the data D to the memory cell array 34 in parallel.

The first delay circuit 40 may delay an input data strobe signal DQS by a second desired (or alternatively, predetermined) delay time and generate a delayed data strobe signal dqs.

The DQT circuit 42-1 may include a second on-die termination resistor, a resistance value of which varies in response to a second variable resistance code RTTc2, and terminate the data applied through the data terminal DQP.

The DQST circuit 42-2 may include a first on-die termination resistor, a resistance value of which varies in response to a first variable resistance code RTTc1, and terminate the data strobe signal applied through the data strobe signal terminal DQSP.

The ODTDQ control circuit 44-1 may generate the second variable resistance code RTTc2 using the value of the on-die termination code ODTC in response to a second on-die termination control signal ODTDQ, when the write command WR is received.

The ODTDQS control circuit 44-2 may generate the first variable resistance code RTTc1 using the value of the on-die termination code ODTC in response to the first on-die termination control signal ODTDQS, when the write command WR is received.

The second delay circuit 46 may generate the second on-die termination control signal ODTDQ by delaying the first on-die termination control signal ODTDQS by the first desired (or alternatively, predetermined) delay time tDQS2DQ.

In the above description, the first desired (or alternatively, predetermined) delay time tDQS2DQ may be a delay time until the data strobe signal DQS reaches from the data strobe signal terminal DQSP to the DQ input buffer 16-1 through the DQS input buffer 16-2 and the first delay circuit 40.

FIG. 4 is a command truth table according to a command and address applied from the memory controller 200 shown in FIG. 1 to the semiconductor memory device 100 shown in FIGS. 2 and 3.

Referring to FIGS. 1 to 4, in order to apply an activate command ACTIVATE, the memory controller 200 may apply signals CA1 and CA2 (which are included in the command and address CA) of "low" levels with an inverted chip selection signal CSB of a "low" level at a first rising edge of the clock signal CK. In order to apply a write command WRITE, the memory controller 200 may apply signals CA1 to CA5 (which are included in the command and address CA) of a "high" level, a "low" level, a "high" level, a "high" level, and a "low" level with the inverted chip selection signal CSB of a "low" level at the first rising edge of the clock signal CK. In order to apply a read command READ, the memory controller 200 may apply the signals CA1 to CA5 (which are included in the command and address CA) of a "high" level, a "low" level, a "high" level, a "high" level, and a "high" level with the inverted chip selection signal CSB of a "low" level at the first rising edge of the clock signal CK. In order to apply a mode setting command MODE REGISTER SET, the memory controller 200 may apply the signals CA1 to CA5 (which are included in the command and address CA) of a "high" level, a "low" level, a "high" level, a "low" level, and a "low" level with the inverted chip selection signal CSB of a "low" level at the first rising edge of the clock signal CK.

The memory controller 200 may apply a portion of signals represented as "I" as a row address when applying the activate command ACTIVATE. The memory controller 200 may apply a portion of signals represented as "II" as a column address when applying the write command WRITE or the read command READ. The memory controller 200 may apply a portion of signals represented as "III" as a mode setting code when applying the mode setting command MODE REGISTER SET.

Figure 5:
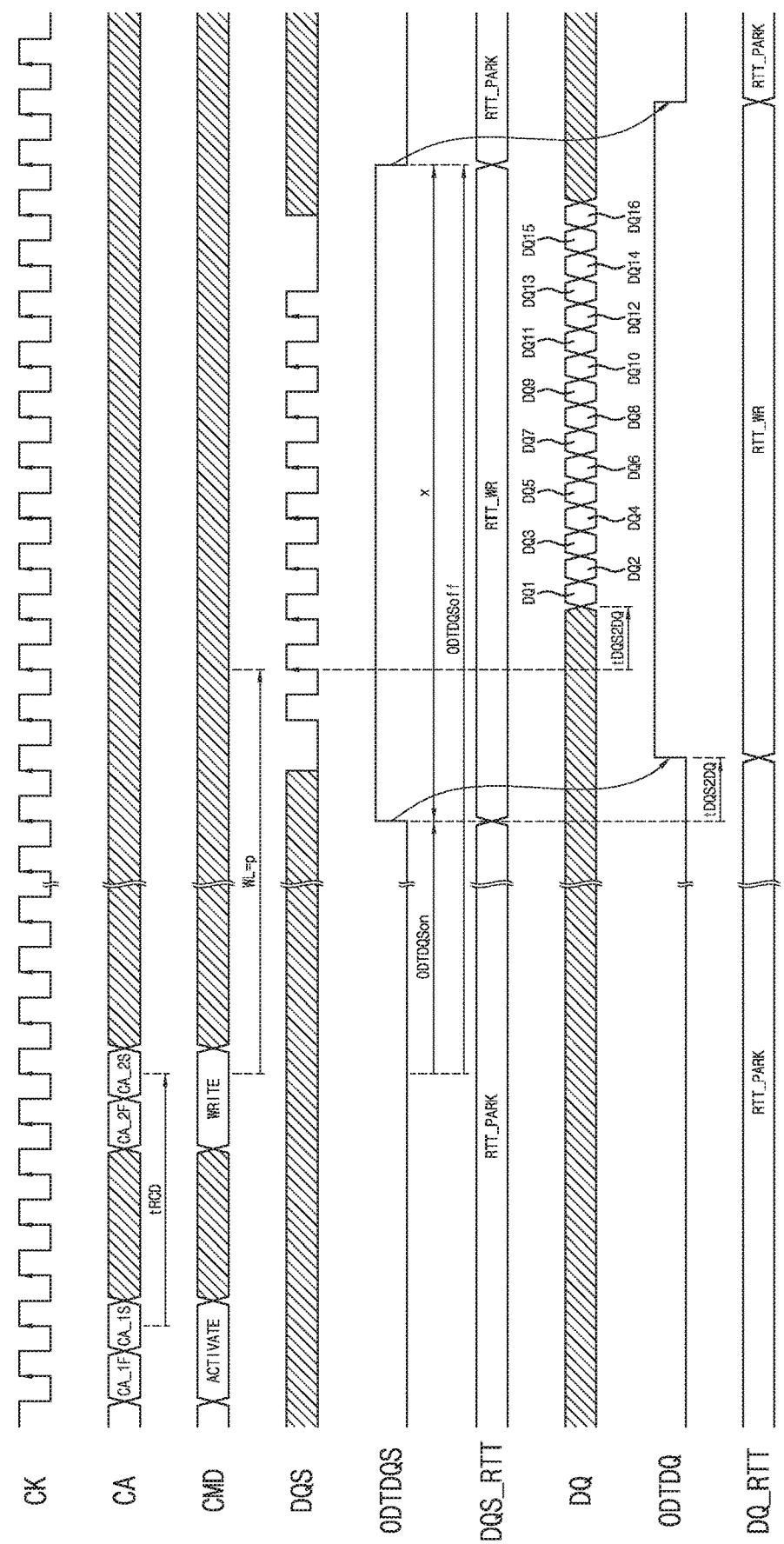
FIG. 5 is an operational timing diagram for describing an on-die termination operation when a write command is applied to the semiconductor memory device shown in FIGS. 2 and 3.

FIG. 5 is an operational timing diagram for describing an on-die termination operation when the write command WRITE is applied to the semiconductor memory device 100 shown in FIGS. 2 and 3. FIG. 5 is an operational timing diagram for describing an operation when the semiconductor memory device 100 is a DDR DRAM device, and the values of the write latency WL, the burst length BL, the write preamble WPRE, the write postamble WPST, the on-die termination on offset ON, and the on-die termination off offset OFF set in the mode setting register 22 are p, 16, 2, 1, −1, and +1, respectively.

Referring to FIGS. 1 to 5, in order to apply an activate command ACTIVATE, the memory controller 200 may apply a command and address CA_1F in response to a first rising edge of the clock signal CK, and apply a command and address CA_1S in response to a second rising edge of the clock signal CK. In order to apply a write command WRITE after a fourth desired (or alternatively, predetermined) delay time tRCD from the activate command ACTIVATE, the memory controller 200 may apply a command and address CA_2F in response to the first rising edge of the clock signal CK, and apply a command and address CA_2S in response to the second rising edge of the clock signal CK. Further, the memory controller 200 may generate a data strobe signal DQS toggling from a clock cycle corresponding to a value obtained by subtracting 2, which is the value of the write preamble WPRE, from p, which is the value of the write latency WL (the write latency WL means the number of clock cycles delayed from the rising edge of the clock signal CK at which the command and address CA_2S is applied), and generate data DQ after being delayed by the first desired (or alternatively, predetermined) delay time tDQS2DQ from p (the value of the write latency WL). That is, the memory controller 200 may generate the data DQ after being delayed by the first desired (or alternatively, predetermined) delay time tDQS2DQ from a first latching edge of the data strobe signal DQS.

When the write command WRITE is applied from the memory controller 200, the command and address generator 20 of the semiconductor memory device 100 may decode a command signal included in the command and address CA_2F, and generate the write command WR. When the write command WR is received, the latency control signal generator 24 may generate the first on-die termination control signal ODTDQS. The latency control signal generator 24 may activate the first on-die termination control signal ODTDQS after the number of clock cycles corresponding to the value of the first on-die termination on latency ODTDQSon, and deactivate the first on-die termination control signal ODTDQS after the number of clock cycles corresponding to the value of the first on-die termination off latency ODTDQSoff, in response to the clock signal CK (the internal clock signal ICK). The value of the first on-die termination on latency ODTDQSon may be a value obtained by adding −1 (the value of the on-die termination on offset ON) and a value obtained by subtracting 2 (the value of the write preamble WPRE) from p (the value of the write latency WL). The value of the first on-die termination off latency ODTDQSoff may be a value obtained by adding +1 (the value of the on-die termination off offset OFF) and a value obtained by adding p (the value of the write latency WL), 8 (the number of clock cycles corresponding to 16 (the value of the burst length BL)), and 1 (the value of the write postamble WPST). The second delay circuit 46 may delay the first on-die termination control signal ODTDQS by the first desired (or alternatively, predetermined) delay time tDQS2DQ, and generate the second on-die termination control signal ODTDQ. The ODTDQS control circuit 44-2 may maintain the first variable resistance code RTTc1 as a basic value, and maintain the resistance value of the first on-die termination resistor (not shown) of the DQST circuit 42-2 to have a first value RTT_PARK during a deactivation period of the first on-die termination control signal ODTDQS. Further, the ODTDQS control circuit 44-2 may vary the resistance value of the first on-die termination resistor (not shown) of the DQST circuit 42-2 as a second value RTT_WR because the first variable resistance code RTTc1 varies according to the on-die termination code ODTC during an activation period of the first on-die termination control signal ODTDQS. Likewise, the ODTDQ control circuit 44-1 may maintain the second variable resistance code RTTc2 as the basic value, and maintain the resistance value of the second on-die termination resistor (not shown) of the DQT circuit 42-1 as the first value RTT_PARK during a deactivation period of the second on-die termination control signal ODTDQ. Further, the ODTDQ control circuit 44-1 may vary the resistance value of the second on-die termination resistor (not shown) as the second value RTT_WR because the second variable resistance code RTTc2 varies according to the on-die termination code ODTC during an activation period of the second on-die termination control signal ODTDQ.

Figure 6:
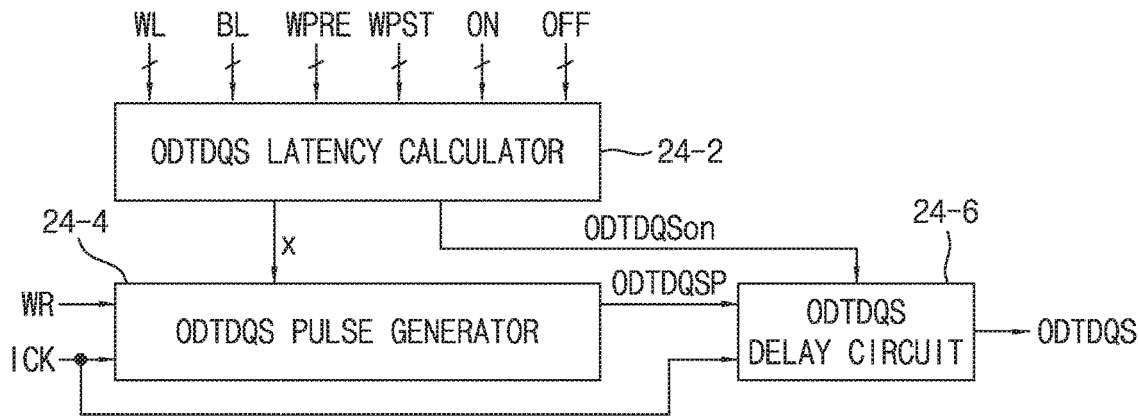
FIG. 6 is a block diagram illustrating a configuration of an example of a latency control signal generator shown in FIG. 2.

FIG. 6 is a block diagram illustrating a configuration of an example of the latency control signal generator 24 shown in FIG. 2. The latency control signal generator 24 may include an ODTDQS latency calculator 24-2, an ODTDQS pulse generator 24-4, and an ODTDQS delay circuit 24-6.

A function of each of the circuit blocks shown in FIG. 6 will be described below.

The ODTDQS latency calculator 24-2 may receive the values of the write latency WL, the burst length BL, the write preamble WPRE, the write postamble WPST, the on-die termination on offset ON, and the on-die termination off offset OFF, and calculate the value of the first on-die termination on latency ODTDQSon, and the value of the first on-die termination off latency ODTDQSoff. Further, the ODTDQS latency calculator 24-2 may calculate x which is a value obtained by subtracting the value of the first on-die termination off latency ODTDQSoff from the value of the first on-die termination on latency ODTDQSon.

When the write command WR is generated (e.g., upon receiving the write command WR), the ODTDQS pulse generator 24-4 may generate a first on-die termination latency pulse signal ODTDQSP. The ODTDQS pulse generator 24-4 may activate the first on-die termination latency pulse signal ODTDQSP in response to a rising edge of the clock signal CK (e.g., the internal clock signal ICK) at which the command and address CA_2S is applied, and deactivate the first on-die termination latency pulse signal ODTDQSP after the number of clock cycles corresponding to the value x.

The ODTDQS delay circuit 24-6 may delay the first on-die termination latency pulse signal ODTDQSP by the number of clock cycles corresponding to the value of the first on-die termination on latency ODTDQSon, and generate the first on-die termination control signal ODTDQS.

Figure 7:
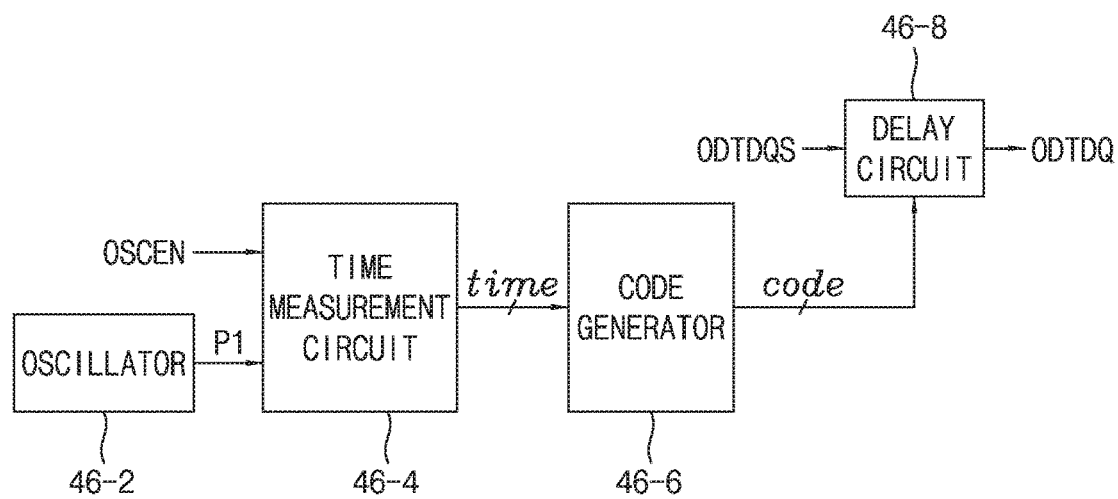
FIG. 7 is a block diagram illustrating a configuration of an example of a second delay circuit shown in FIG. 3.
Figure 8:
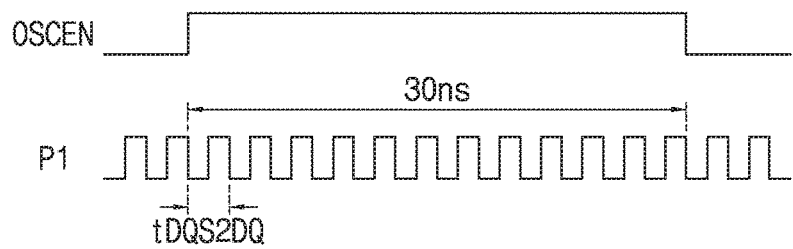
FIG. 8 is a timing diagram illustrating an oscillation period signal and a pulse signal shown in FIG. 7.

FIG. 7 is a block diagram illustrating a configuration of an example of the second delay circuit 46 shown in FIG. 3. The second delay circuit 46 may include an oscillator 46-2, a time measurement circuit 46-4, a code generator 46-6, and a delay circuit 46-8. FIG. 8 is a timing diagram illustrating an oscillation period signal OSCEN and a pulse signal P shown in FIG. 7.

A function of each of the blocks shown in FIG. 7 will be described below.

The oscillator 46-2 may generate a pulse signal P whose cycle is the first desired (or alternatively, predetermined) delay time tDQS2DQ. Although not shown, the oscillator 46-2 may be configured to connect a desired (or alternatively, predetermined) number of differential amplifiers in a ring type.

The time measurement circuit 46-4 may count the number of pulses of the pulse signal P generated during an activation period of the oscillation period signal OSCEN, calculate the first desired (or alternatively, predetermined) delay time tDQS2DQ, and output a time signal time.

Referring to FIG. 8, for example, when the activation period of the oscillation period signal OSCEN is 30 ns and 12 pulses of the pulse signal P are generated, the time measurement circuit 48-4 may output the time signal time of 2.5 ns (e.g., 30 ns/12). The time signal time output from the time measurement circuit 48-4 may be tDQS2DQ±Δt, which is obtained by adding the first desired (or alternatively, predetermined) delay time tDQS2DQ, and a variation time (e.g., a third desired (or alternatively, predetermined) delay time) Δt of the first desired (or alternatively, predetermined) delay time tDQS2DQ according to process, voltage, and/or temperature (PVT) variations in a path in which the data strobe signal DQS is transmitted to a data strobe signal input terminal (not shown) of the DQ input buffer 16-1 through the DQS input buffer 16-2 and the first delay circuit 40. The oscillation period signal OSCEN may be generated from the memory controller 200 shown in FIG. 1.

The code generator 46-6 may receive the time signal time from the time measurement circuit 46-4, and generate a code code corresponding to the time signal time. For example, when the time signal time is 2.5 ns, the code generator 48-6 may generate an n-bit code code corresponding to 2.5 ns.

The delay circuit 46-8 may receive the code code from the code generator 46-4, adjust a delay time in response to the code code, delay the first on-die termination control signal ODTDQS by the adjusted delay time tDQS2DQ±Δt, and generate the second on-die termination control signal ODTDQ.

Accordingly, when the first desired (or alternatively, predetermined) delay time tDQS2DQ is varied by the third desired (or alternatively, predetermined) delay time Δt according to the PVT variations until the data strobe signal DQS reaches the DQ input buffer 16-1 through the DQS terminal DQSP, the DQS input buffer 16-2, and the first delay circuit 40, the second delay circuit 46 shown in FIG. 7 may delay the first on-die termination control signal ODTDQS by the adjusted delay time tDQS2DQ±Δt, and generate the second on-die termination control signal ODTDQ.

Figure 9:
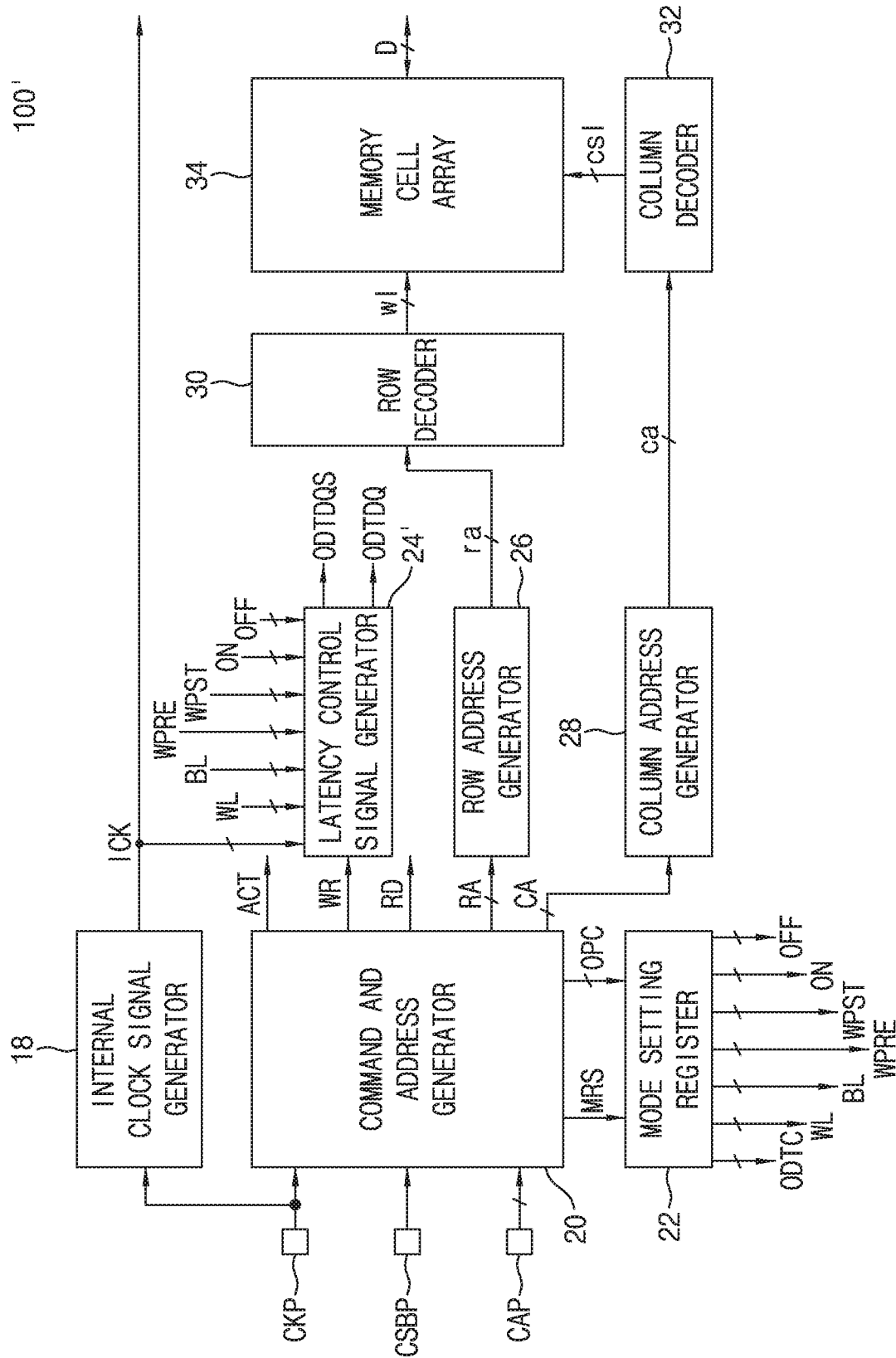
FIGS. 9 and 10 are block diagrams illustrating a configuration of a semiconductor memory device according to an example embodiment of the inventive concepts.
Figure 10:
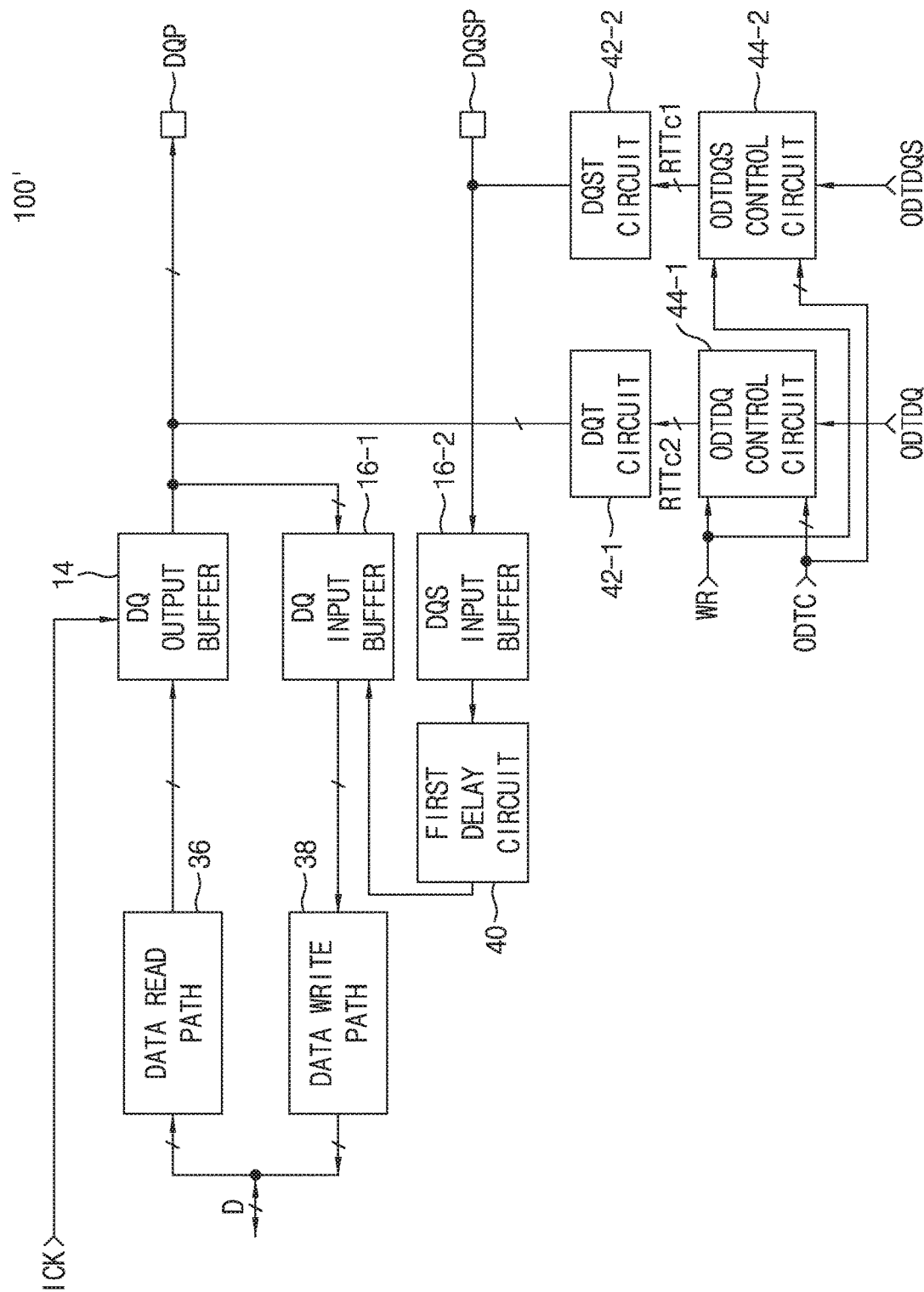

FIGS. 9 and 10 are block diagrams illustrating a configuration of a semiconductor memory device 100' according to an example embodiment of the inventive concepts. The semiconductor memory device 100' may be configured to not to include the second delay circuit 46 of the semiconductor memory device 100 shown in FIG. 3, and substitute the latency control signal generator 24 shown in FIG. 2 with a latency control signal generator 24'.

In the blocks shown in FIGS. 9 and 10, a function of each of the blocks having the same reference numeral as each of the blocks shown in FIGS. 2 and 3 will be easily understood with reference to the description of FIGS. 2 and 3. Here, a function of the substituted block will be described.

Like the latency control signal generator 24 shown in FIG. 2, when the write command WR is generated (e.g., upon receiving the write command WR), the latency control signal generator 24' may generate the first on-die termination control signal ODTDQS. Further, when the write command WR is generated (e.g., upon receiving the write command WR), the latency control signal generator 24' may generate the second on-die termination control signal ODTDQ. The latency control signal generator 24' may activate the second on-die termination control signal ODTDQ after the number of clock cycles corresponding to the value of the second on-die termination on latency ODTDQon and may deactivate the second on-die termination control signal ODTDQ after the number of clock cycles corresponding to the value of the second on-die termination off latency ODTDQoff, in response to the internal clock signal ICK. The value of the second on-die termination on latency ODTDQon may be generated using the value of the write latency WL. For example, the value of the second on-die termination on latency ODTDQon may be a value obtained by adding the value of the on-die termination on offset ON and the value of the write latency WL, that is, WL+ON, or the value of the write latency WL. As described above, the value of the on-die termination on offset ON may be in the range of +1 to −3, and for example, −1. The value of the second on-die termination off latency ODTDQoff may be generated using the value of the write latency WL and the value of the burst length BL. For example, the value of the second on-die termination off latency ODTDQoff may be a value obtained by adding the value of the write latency WL, the number of clock cycles corresponding to the value of the burst length BL (when the semiconductor memory device 100' is a DDR DRAM device, BL/2), the value of the write postamble WPST, and the value of the on-die termination off offset OFF, that is, WL+BL/2+WPST+OFF, or a value obtained by adding the value of the write latency WL, the number of clock cycles corresponding to the value of the burst length BL (=BL/2), and the value of the on-die termination off offset OFF, that is, WL+BL/2+OFF. As described above, the value of the on-die termination off offset OFF may be in the range of −1 to +3.

When the write command WR is generated (e.g., upon receiving the write command WR), the ODTDQ control circuit 44-1 may output the on-die termination code ODTC as the second variable resistance code RTTc2 in response to the second on-die termination control signal ODTDQ, which is output from the latency control signal generator 24'.

Figure 11:
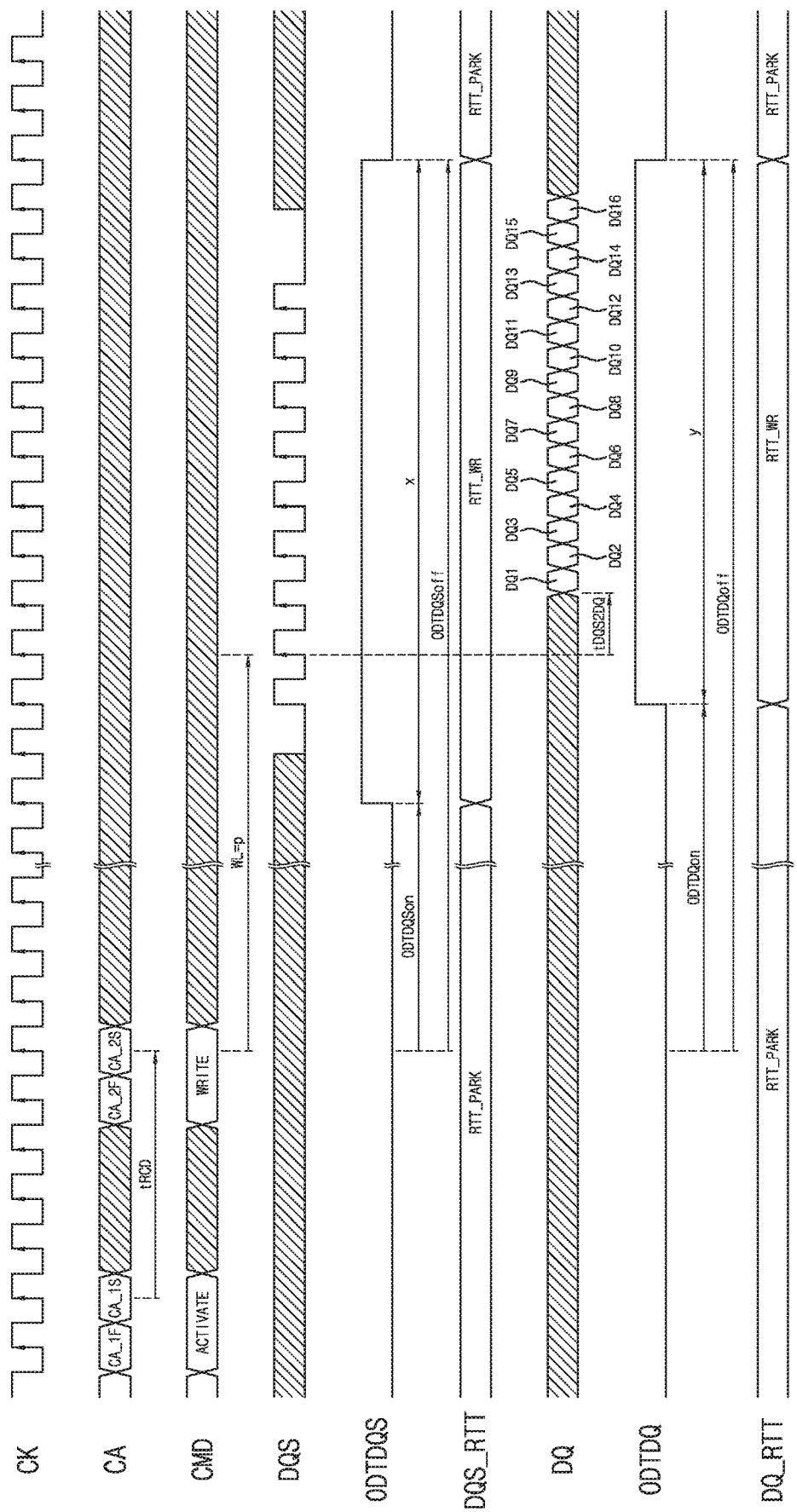
FIG. 11 is an operational timing diagram for describing an on-die termination operation when a write command is applied to the semiconductor memory device shown in FIGS. 9 and 10.

FIG. 11 is an operational timing diagram for describing an on-die termination operation when a write command is applied to the semiconductor memory device 100' shown in FIGS. 9 and 10. Like the operational timing diagram shown in FIG. 5, the activate command ACTIVATE, the write command WRITE, the data strobe signal DQS, and the data DQ may be applied from the memory controller 200 to the semiconductor memory device 100'.

Further, like FIG. 5, FIG. 11 is an operational timing diagram for describing an operation when the semiconductor memory device 100' is the DDR DRAM device, and the values of the write latency WL, the burst length BL, the write preamble WPRE, the write postamble WPST, the on-die termination on offset ON, and the on-die termination off offset OFF set in the mode setting register 22 are p, 16, 2, 1, −1, and +1, respectively.

Referring to FIGS. 1, 9, 10 and 11, like FIG. 5, when the write command WR is generated (e.g., upon receiving the write command WR), the latency control signal generator 24' of the semiconductor memory device 100' may generate the first on-die termination control signal ODTDQS. When the write command WR is generated (e.g., upon receiving the write command WR), the latency control signal generator 24' may generate the second on-die termination control signal ODTDQ. The latency control signal generator 24' may activate the second on-die termination control signal ODTDQ after the number of clock cycles corresponding to the value of the second on-die termination on latency ODTDQon, and may deactivate the second on-die termination control signal ODTDQ after the number of clock cycles corresponding to the value of the second on-die termination off latency ODTDQoff. The value of the second on-die termination on latency ODTDQon may be a value obtained by adding p (the value of the write latency WL) and −1 (the value of the on-die termination on offset ON). The value of the first on-die termination off latency ODTDQoff may be a value obtained by adding p (the value of the write latency WL), 8 (the number of clock cycles corresponding to the value of the burst length BL of, for example, 16), 1 (the value of the write postamble WPST), and +1 (the value of the on-die termination off offset OFF).

Figure 12:
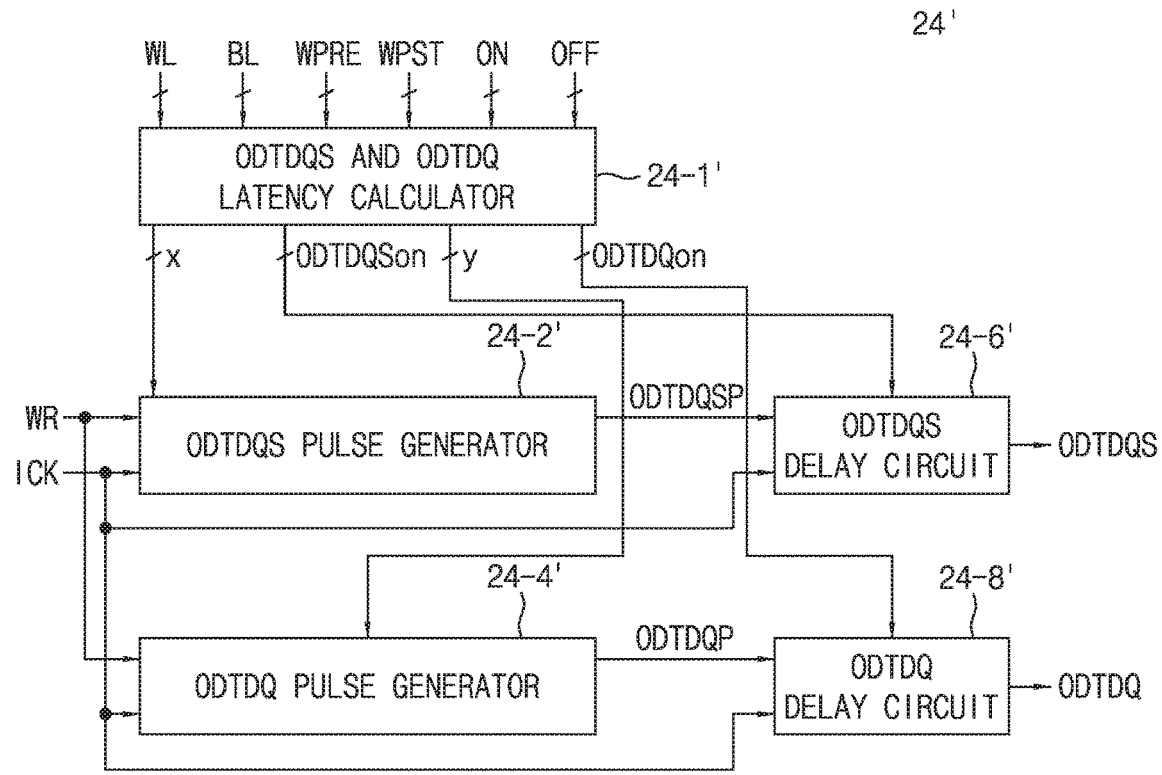
FIG. 12 is a block diagram illustrating a configuration of an example of a latency control signal generator shown in FIG. 9.

FIG. 12 is a block diagram illustrating a configuration of an example of the latency control signal generator 24' shown in FIG. 9. The latency control signal generator 24' may include an ODTDQS and ODTDQ latency calculator 24-1', an ODTDQS pulse generator 24-2', an ODTDQ pulse generator 24-4', an ODTDQS delay circuit 24-6', and an ODTDQ delay circuit 24-8'.

A function of each of the blocks shown in FIG. 12 will be described below.

Each of the ODTDQS pulse generator 24-2' and the ODTDQS delay circuit 24-6' may perform the same function as each of the ODTDQS pulse generator 24-4 and the ODTDQS delay circuit 24-6 shown in FIG. 6.

Like the ODTDQS latency calculator 24-2 shown in FIG. 6, the ODTDQS and ODTDQ latency calculator 24-1' may calculate the value of the first on-die termination on latency ODTDQSon, the value of the first on-die termination off latency ODTDQSoff, and x which is a value obtained by subtracting the value of the first on-die termination off latency ODTDQSoff from the value of the first on-die termination on latency ODTDQSon. Further, the ODTDQS and ODTDQ latency calculator 24-1' may receive the values of the write latency WL, the burst length BL, the write preamble WPRE, the write postamble WPST, the on-die termination on offset ON, and the on-die termination off offset OFF, and calculate the value of the second on-die termination on latency ODTDQon and the value of the second on-die termination off latency ODTDQoff. Further, the ODTDQS and ODTDQ latency calculator 24-1' may calculate y which is a value obtained by subtracting the value of the second on-die termination off latency ODTDQoff from the value of the second on-die termination on latency ODTDQon.

When the write command WR is generated (e.g., upon receiving the write command WR), the ODTDQ pulse generator 24-4' may generate a second on-die termination latency pulse signal ODTDQP. the ODTDQ pulse generator 24-4' may activate the second on-die termination latency pulse signal ODTDQP in response to a rising edge of the clock signal CK (e.g., the internal clock signal ICK) at which the command and address CA_2S is applied, and may deactivate the second on-die termination latency pulse signal ODTDQP after the number of clock cycles corresponding to the value y.

The ODTDQ delay circuit 24-8' may delay the second on-die termination latency pulse signal ODTDQP by the number of clock cycles corresponding to the value of the second on-die termination on latency ODTDQon, and generate the second on-die termination control signal ODTDQ.

Figure 13:
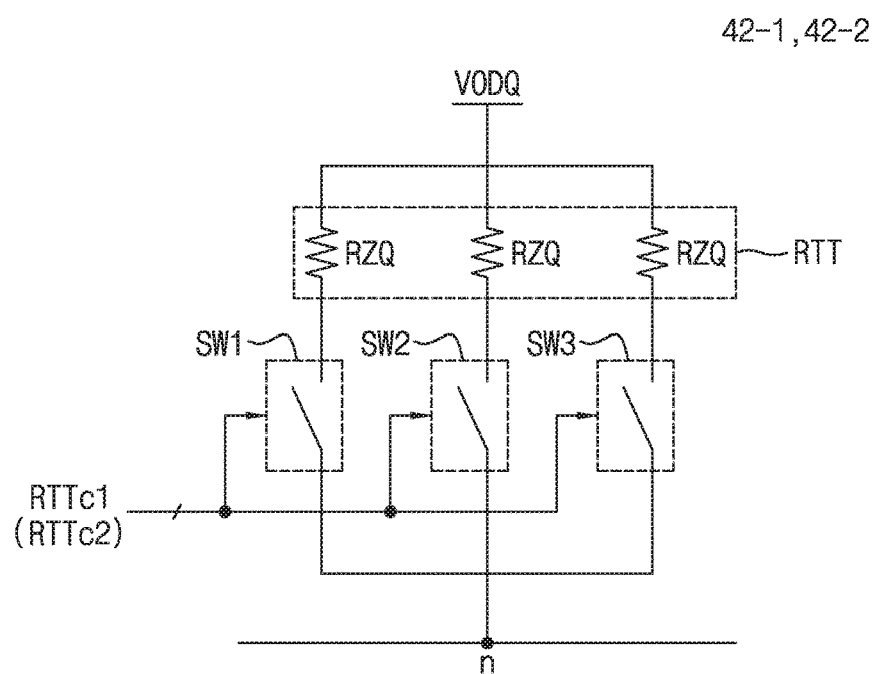
FIG. 13 is a diagram illustrating configurations of a data termination circuit and a data strobe signal termination circuit according to an example embodiment of the inventive concepts.

FIG. 13 is a diagram illustrating configurations of the DQT circuit 42-1 and the DQST circuit 42-2 according to an example embodiment of the inventive concepts. Each of the DQT circuit 42-1 and the DQST circuit 42-2 may include an on-die termination resistor RTT including resistors RZQ, and switches SW1 to SW3. Each of the DQT circuit 42-1 and the DQST circuit 42-2 shown in FIG. 13 illustrates an example in which the value of the first on-die termination resistor or the second on-die termination resistor RTT is varied according to a 3-bit variable resistance code RTTc (e.g., RTTc1 or RTTC 2).

Referring to FIG. 13, the resistors RZQ may be connected or may not be connected to a node n because the switches SW1 to SW3 are turned on or off in response to the first or second variable resistance code RTTc1 or RTTc2. For example, when all of 3 bits of the first or second variable resistance code RTTc1 or RTTc2 are "high" levels, all of the switches SW1 to SW3 may be turned on, and the value of the first or second on-die termination resistor RTT connected to the node n may be RZQ/3. When one bit of the first or second variable resistance code RTTc1 or RTTc2 is a "high" level, one of the switches SW1 to SW3 may be turned on, and the value of the first or second on-die termination resistor RTT connected to the node n may be RZQ.

As described above, semiconductor memory devices according to some example embodiments of the inventive concepts may control the first on-die termination resistor and the second on-die termination resistor to have the second value by varying the resistances of the first on-die termination resistor and the second on-die termination resistor during a first period in which the data strobe signal is applied and during a second period in which the data is applied.

According to some example embodiments of the inventive concepts, the semiconductor memory devices and/or memory systems having the same may more efficiently perform the on-die termination operation.

While some example embodiments of the inventive concepts have been described with reference to the accompanying drawings, it should be understood by those skilled in the art that various modifications may be made without departing from the scope of the inventive concepts and without changing essential features. Therefore, the above-described example embodiments should be considered in a descriptive sense only and not for purposes of limitation.

What is claimed is:

1. A semiconductor memory device comprising:
a data strobe signal input buffer configured to receive a data strobe signal and generate an input data strobe signal;
a data input buffer configured to receive data, which is delayed by a first delay time from a first latching edge of the data strobe signal, and generate input data;
a latency control signal generator configured to generate a first on-die termination control signal, which is activated during a first period in which the data strobe signal is applied, in response to receiving a write command;
a first on-die termination control circuit configured to vary a first variable resistance code in response to the first on-die termination control signal;
a data strobe signal termination circuit configured to terminate the data strobe signal, the data strobe signal termination circuit including a first on-die termination resistor, the first on-die termination resistor configured to vary a resistance value thereof in response to the first variable resistance code;
a row decoder configured to decode a row address signal and generate a plurality of word line selection signals;
a column decoder configured to decode a column address signal and generate a plurality of column selection signals; and
a memory cell array including a plurality of memory cells and configured to write the input data to the memory cells selected by the plurality of word line selection signals and the plurality of column selection signals.

2. The semiconductor memory device of claim 1, further comprising:
a first delay circuit configured to delay the input data strobe signal by a second delay time and generate a delayed data strobe signal,
wherein the data input buffer is configured to latch and delay the data in response to the delayed data strobe signal and generate the input data, and
the first delay time is a time between a first time point at which the data strobe signal is received at a data strobe signal terminal and a second time point at which the data strobe signal is applied to the data input buffer through the data strobe signal input buffer and the first delay circuit.

3. The semiconductor memory device of claim 2, further comprising:
a mode setting register configured to set an on-die termination code, a write latency, and a burst length in response to a mode setting command,
wherein in response to receiving the write command the latency control signal generator is configured to generate the first on-die termination control signal, activate the first on-die termination control signal after a number of clock cycles corresponding to a value of a first on-die termination on latency, and deactivate the first on-die termination control signal after a number of clock cycles corresponding to a value of a first on-die termination off latency, where the value of the first on-die termination on latency is generated using a value of the write latency, and the value of the first on-die termination off latency is generated using the value of the write latency and a value of the burst length, and
the first on-die termination control circuit is configured to generate the first variable resistance code using the on-die termination code in response to the first on-die termination control signal.

4. The semiconductor memory device of claim 3, wherein the latency control signal generator comprises:
a first on-die termination latency calculator configured to calculate the value of the first on-die termination on latency, the value of the first on-die termination off latency, and the first period, the first period obtained by subtracting the value of the first on-die termination on latency from the value of the first on-die termination off latency;
a first on-die termination latency pulse generator configured to generate a first on-die termination latency pulse signal in response to receiving the write command, the first on-die termination latency pulse generator further configured to activate the first on-die termination latency pulse signal during the first period; and
a first on-die termination delay circuit configured to delay the first on-die termination latency pulse signal by the number of clock cycles corresponding to the value of the first on-die termination on latency, and generate the first on-die termination control signal.

5. The semiconductor memory device of claim 4, further comprising:
a second delay circuit configured to delay the first on-die termination control signal by the first delay time, and generate a second on-die termination control signal;
a second on-die termination control circuit configured to vary a second variable resistance code in response to the second on-die termination control signal; and
a data termination circuit configured to terminate the data, the data termination circuit including a second on-die termination resistor, the second on-die termination resistor configured to vary a resistance value thereof in response to the second variable resistance code.

6. The semiconductor memory device of claim 5, wherein the second delay circuit comprises:
an oscillator configured to generate a pulse signal, a cycle of the pulse signal being the first delay time;
a time measurement circuit configured to count a number of pulses of the pulse signal generated during an activation period of an oscillation period signal, calculate the first delay time, and generate a time signal;
a code generator configured to generate a code corresponding to the time signal; and
a delay circuit configured to adjust the first delay time in response to the code, delay the first on-die termination control signal by the adjusted first delay time, and generate the second on-die termination control signal.

7. The semiconductor memory device of claim 5, wherein each of the data termination circuit and the data strobe signal termination circuit comprises:
a plurality of resistors each connected between a voltage and each of a plurality of first nodes; and
a plurality of switches configured to be turned on/off in response to the first variable resistance code or the second variable resistance code, the plurality of switches each connected (i) between each of the plurality of first nodes and a data terminal to which the data is applied in the data termination circuit, and (ii) between each of the plurality of first nodes and the data strobe signal terminal to which the data strobe signal is applied in the data strobe signal termination circuit.

8. A semiconductor memory device comprising:
a data strobe signal input buffer configured to receive a data strobe signal and generate an input data strobe signal;
a data input buffer configured to receive data, which is delayed by a first delay time from a first latching edge of the data strobe signal, and generate input data;
a latency control signal generator configured to generate a first on-die termination control signal and a second on-die termination control signal in response to receiving a write command, the latency control signal generator configured to activate the first on-die termination control signal during a first period in which the data strobe signal is applied, the latency control signal generator configured to activate the second on-die termination control signal during a second period in which the data is applied;
a first on-die termination control circuit configured to vary a first variable resistance code in response to the first on-die termination control signal;
a second on-die termination control circuit configured to vary a second variable resistance code in response to the second on-die termination control signal;
a data strobe signal termination circuit configured to terminate the data strobe signal, the data strobe signal termination circuit including a first on-die termination resistor, the first on-die termination resistor configured to vary a resistance value thereof in response to the first variable resistance code;
a data termination circuit configured to terminate the data, the data termination circuit including a second on-die termination resistor, the second on-die termination resistor configured to vary a resistance value thereof in response to the second variable resistance code;
a row decoder configured to decode a row address signal and generate a plurality of word line selection signals;
a column decoder configured to decode a column address signal and generate a plurality of column selection signals; and
a memory cell array including a plurality of memory cells and configured to write the input data to the memory cells selected by the plurality of word line selection signals and the plurality of column selection signals.

9. The semiconductor memory device of claim 8, further comprising:
a first delay circuit configured to delay the input data strobe signal by a second delay time and generate a delayed data strobe signal,
wherein the data input buffer is configured to latch and delay the data in response to the delayed data strobe signal and generate the input data, and
the first delay time is a time between a first time point at which the data strobe signal is received at a data strobe signal terminal and a second time point at which the data strobe signal is applied to the data input buffer through the data strobe signal input buffer and the first delay circuit.

10. The semiconductor memory device of claim 9, further comprising:
a mode setting register configured to set an on-die termination code, an on-die termination off offset, a write latency, and a burst length in response to a mode setting command,
wherein in response to receiving the write command,
the latency control signal generator is configured to generate the first on-die termination control signal, activate the first on-die termination control signal after a number of clock cycles corresponding to a value of a first on-die termination on latency, and deactivate the first on-die termination control signal after the number of clock cycles corresponding to a value of a first on-die termination off latency, where the value of the first on-die termination on latency is generated using a value of the write latency, and the value of the first on-die termination off latency is generated using the value of the write latency and a value of the burst length,
the latency control signal generator is further configured to generate the second on-die termination control signal, activate the second on-die termination control signal after the number of clock cycles corresponding to a value of a second on-die termination on latency, and deactivate the second on-die termination control signal after the number of clock cycles corresponding to a value of a second on-die termination off latency, where the value of the second on-die termination on latency is generated using the value of the write latency, and the value of the second on-die termination off latency is generated using the value of the write latency, the value of the burst length, and a value of the on-die termination off offset, the first on-die termination control circuit configured to generate the first variable resistance code using the on-die termination code in response to the first on-die termination control signal, and the second on-die termination control circuit configured to generate the second variable resistance code using the on-die termination code in response to the second on-die termination control signal.

11. The semiconductor memory device of claim 10, wherein the latency control signal generator comprises:
a first and second on-die termination latency calculator configured to calculate the value of the first on-die termination on latency, the value of the first on-die termination off latency, the value of the second on-die termination on latency, the value of the second on-die termination off latency, the first period, and the second period, the first period obtained by subtracting the value of the first on-die termination on latency from the value of the first on-die termination off latency, the second period obtained by subtracting the value of the second on-die termination on latency from the value of the second on-die termination off latency;
a first on-die termination latency pulse generator configured to generate a first on-die termination latency pulse signal in response to receiving the write command, the first on-die termination latency pulse generator further configured to activate the first on-die termination latency pulse signal during the first period;
a second on-die termination latency pulse generator configured to generate a second on-die termination latency pulse signal in response to receiving the write command, the second on-die termination latency pulse generator further configured to activate the second on-die termination latency pulse signal during the second period;
a first on-die termination delay circuit configured to delay the first on-die termination latency pulse signal by the number of clock cycles corresponding to the value of the first on-die termination on latency, and generate the first on-die termination control signal; and
a second on-die termination delay circuit configured to delay the second on-die termination latency pulse signal by the number of clock cycles corresponding to the value of the second on-die termination on latency, and generate the second on-die termination control signal.

12. The semiconductor memory device of claim 8, wherein each of the data termination circuit and the data strobe signal termination circuit comprises:
a plurality of resistors each connected between a voltage and each of a plurality of first nodes; and
a plurality of switches configured to be turned on/off in response to the first or second variable resistance code, the plurality of switches each connected between each of the plurality of first nodes and a data terminal to which the data is applied in the data termination circuit, and (ii) between each of the plurality of first nodes and a data strobe signal terminal to which the data strobe signal is applied in the data strobe signal termination circuit.

13. A memory system comprising:
a memory controller configured to transmit a first inverted chip selection signal and a second inverted chip selection signal;
a first memory configured to be selected in response to the first inverted chip selection signal; and a second memory configured to be selected in response to the second inverted chip selection signal, each of the first and the second memories comprising,
a data strobe signal input buffer configured to receive a data strobe signal transmitted from the memory controller, and generate an input data strobe signal,
a data input buffer configured to receive data, which is delayed by a first delay time from a first latching edge of the data strobe signal, and generate input data,
a latency control signal generator configured to generate a first on-die termination control signal, which is activated during a first period in which the data strobe signal is applied, in response to receiving a write command,
a first on-die termination control circuit configured to vary a first variable resistance code in response to the first on-die termination control signal,
a data strobe signal termination circuit configured to terminate the data strobe signal, the data strobe signal termination circuit including a first on-die termination resistor, the first on-die termination resistor configured to vary a resistance value thereof in response to the first variable resistance code,
a row decoder configured to decode a row address signal and generate a plurality of word line selection signals,
a column decoder configured to decode a column address signal and generate a plurality of column selection signals, and
a memory cell array including a plurality of memory cells and configured to write the input data to the memory cells selected by the plurality of word line selection signals and the column selection signals.

14. The memory system of claim 13, wherein each of the first and the second memories further comprises:
a first delay circuit configured to delay the input data strobe signal by a second delay time and generate a delayed data strobe signal;
wherein the data input buffer is configured to latch and delay the data in response to the delayed data strobe signal and generate the input data; and
the first delay time is a time between a first time point at which the data strobe signal is received at a data strobe signal terminal and a second time point at which the data strobe signal is applied to the data input buffer through the data strobe signal input buffer and the first delay circuit.

15. The memory system of claim 14, wherein each of the first and the second memories further comprises:
a mode setting register configured to set an on-die termination code, a write latency, and a burst length in response to a mode setting command,
wherein in response to receiving the write command, the latency control signal generator is configured to generate the first on-die termination control signal, activate the first on-die termination control signal after a number of clock cycles corresponding to a value of a first on-die termination on latency, and deactivate the first on-die termination control signal after the number of clock cycles corresponding to a value of a first on-die termination off latency, where the value of the first on-die termination on latency is generated using a value of the write latency, and the value of the first on-die termination off latency is generated using the value of the write latency and a value of the burst length, and the first on-die termination control circuit is configured to the first variable resistance code using the on-die termination code in response to the first on-die termination control signal.

16. The memory system of claim 15, wherein each of the first and the second memories further comprises:
   a second delay circuit configured to delay the first on-die termination control signal by the first delay time, and generate a second on-die termination control signal;
   a second on-die termination control circuit configured to vary a second variable resistance code in response to the second on-die termination control signal; and
   a data termination circuit configured to termination the data, the data termination circuit including a second on-die termination resistor, the second on-die termination resistor configured to vary a resistance value thereof in response to the second variable resistance code.

17. The memory system of claim 16, wherein the second delay circuit comprises:
   an oscillator configured to generate a pulse signal, a cycle of the pulse signal being the first delay time;
   a time measurement circuit configured to count a number of pulses of the pulse signal generated during an activation period of an oscillation period signal, calculate the first delay time, and generate a time signal;
   a code generator configured to generate a code corresponding to the time signal; and
   a delay circuit configured to adjust the first delay time in response to the code, delay the first on-die termination control signal by the adjusted first delay time, and generate the second on-die termination control signal.

18. The memory system of claim 16, wherein the latency control signal generator is further configured to generate the second on-die termination control signal, and activate the second on-die termination control signal during a second period in which the data is applied.

19. The memory system of claim 18, wherein
   the mode setting register is further configured to set an on-die termination off offset in response to the mode setting command,
   wherein in response to receiving the write command,
   the latency control signal generator further configured to generate the second on-die termination control signal, activate the second on-die termination control signal after the number of clock cycles corresponding to a value of a second on-die termination on latency, and deactivate the second on-die termination control signal after the number of clock cycles corresponding to a value of a second on-die termination off latency, where the value of the second on-die termination on latency generated using the value of the write latency, and the value of the second on-die termination off latency is generated using the value of the write latency, the value of the burst length, and a value of the on-die termination off offset,
   the first on-die termination control circuit is configured to generate the first variable resistance code using the on-die termination code in response to the first on-die termination control signal, and
   the second on-die termination control circuit is configured to generate the second variable resistance code using the on-die termination code in response to the second on-die termination control signal.

20. The memory system of claim 19, wherein the latency control signal generator comprises:
   first and second on-die termination latency calculators configured to calculate the value of the first on-die termination on latency, the value of the first on-die termination off latency, the value of the second on-die termination on latency, the value of the second on-die termination off latency, the first period, and the second period, the first period obtained by subtracting the value of the first on-die termination on latency from the value of the first on-die termination off latency, the second period obtained by subtracting the value of the second on-die termination on latency from the value of the second on-die termination off latency;
   a first on-die termination latency pulse generator configured to generate a first on-die termination latency pulse signal in response to receiving the write command, the first on-die termination latency pulse generator configured to activate the first on-die termination latency pulse signal during the first period;
   a second on-die termination latency pulse generator configured to generate a second on-die termination latency pulse signal in response to receiving the write command, the second on-die termination latency pulse generator configured to activate the second on-die termination latency pulse signal during the second period;
   a first on-die termination delay circuit configured to delay the first on-die termination latency pulse signal by the number of clock cycles corresponding to the value of the first on-die termination on latency, and generate the first on-die termination control signal; and
   a second on-die termination delay circuit configured to delay the second on-die termination latency pulse signal by the number of clock cycles corresponding to the value of the second on-die termination on latency, and generate the second on-die termination control signal.

* * * * *